United States Patent [19]

Burns

[11] Patent Number: 4,643,796
[45] Date of Patent: Feb. 17, 1987

[54] MOLY MASK REMOVAL TOOL

[75] Inventor: Richard W. Burns, Manassas, Va.

[73] Assignee: International Business Machines Corporation, Armonk, N.Y.

[21] Appl. No.: 776,184

[22] Filed: Sep. 13, 1985

[51] Int. Cl.⁴ .............................................. B32B 31/18
[52] U.S. Cl. ..................... 156/584; 29/426.4; 29/762; 156/344; 156/631; 228/264
[58] Field of Search ............... 29/426.4, 762; 156/344, 156/584, 631; 228/264

[56] References Cited

U.S. PATENT DOCUMENTS

| | | | |
|---|---|---|---|
| 3,303,979 | 2/1967 | Lang | 225/1 |
| 3,494,093 | 12/1969 | Mermelstein | 269/21 |
| 3,955,163 | 5/1976 | Novak | 355/132 |
| 3,960,623 | 6/1976 | Gantley | 156/344 X |
| 4,255,216 | 3/1981 | Conant et al. | 156/584 X |

Primary Examiner—Robert A. Dawson
Attorney, Agent, or Firm—Jeffrey S. LaBaw; Jesse L. Abzug; John E. Hoel

[57] ABSTRACT

An apparatus for removing a mask which extends beyond the outer edges of a semiconductor wafer bonded thereto. The apparatus includes a base having a vacuum chamber opening onto the upper surface of the base, a vacuum valve separating the vacuum chamber from a vacuum source, an actuating lever and a mask discharge facilitator. The discharge facilitator comprising a horizontal plate having a plurality of vertical pins around the periphery thereof. When the lever is actuated, it opens the vacuum valve and lifts the discharge facilitator forcing the vertical pins into contact with the mask. The simultaneous application of the vacuum holding force, and vertical force applied by the pins causes the separation of the mask from the upper surface of the wafer.

14 Claims, 3 Drawing Figures

MOLY MASK REMOVAL TOOL

BACKGROUND

In the production of silicon wafers, a mask is typically utilized as a contact mask to provide a pattern of tin lead contacts. To form the tin lead contacts on the wafer, a mask is applied to the wafer, and the mask-wafer composite is exposed in a tin lead evaporation chamber. Tin lead is evaporated through the holes in the mask onto the wafer and the pattern of the holes in the mask dictates the pattern of the tin lead contacts.

As a result of this process, the tin lead forms a bond of solder between the mask and wafer. The tin lead bonds partially cover the opposite facing surfaces of the mask and wafer, i.e., extent of coverage depends on the mask pattern. The conventional technique for removing the mask from the wafer is to manually peel the mask from the wafer.

Manual peeling the mask from the wafer is an operator dependent procedure. Thus, controlled, uniform, and repeatable results are not readily obtainable. The major yield problem caused by this manual process are that when operators peel the masks from the wafers, they cause damage to either the mask or wafer or both. This damage decreases wafer yields, and in addition increases the cost of the final product because masks that are normally cleaned and reused are damaged so that they cannot be reused.

To increase wafer yields and the reutilization of masks, meticulous operator handling is required. This results in increased process times, labor costs and training costs. Moreover, substantially improved results are not guaranteed with meticulous operator handling. Thus, utilization of known means and methods to remove masks from wafers after tin lead evaporation results in damage to wafers and masks resulting in decreased yields, increased cost and process time. Therefore, it is a primary object of this invention to provide a means for removing a mask from a wafer without damaging the mask or wafer.

It is a further object of this invention to provide a means for removing a mask from a wafer that is not operator dependent.

It is a further object to provide a controlled, uniform, repeatable method of removing masks from wafers.

SUMMARY OF THE INVENTION

Accordingly, the mask removal apparatus of the present invention uniformly and repeatedly removes masks which extend beyond the outer edges of semiconductor wafers that they are bonded to. The apparatus includes a base having a vacuum chamber, a vacuum chuck at the top surface of the base, a vacuum valve separating the vacuum chamber from a vacuum source, a mask discharge facilitator having vertical pins that extend upward toward the mask, and an actuating lever.

During operation, after a bonded mask-wafer composite is placed on the top surface of the base, the lever is actuated opening the vacuum valve. The lever simultaneously lifts the plate of the mask discharge facilitator to bring the vertical pins into contact with the mask, applying a separating force to effect the separation of the mask from the upper surface of the wafer. When the lever is released, the vacuum valve closes, and the wafer is removed from the apparatus. A new mask-wafer composite is then placed on the surface of the base, and the separation process is repeated.

Further details and advantages of my invention will be apparent from the following specification and accompanying drawings.

DETAILED DESCRIPTION OF PREFERRED EMBODIMENT

Figure 1:
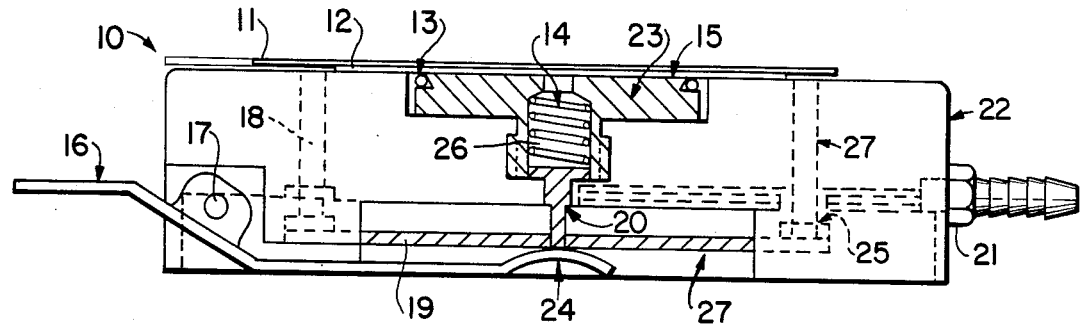
FIG. 1 is a front elevation of an embodiment of the mask removal apparatus of the present invention before the apparatus is activated.
Figure 2:
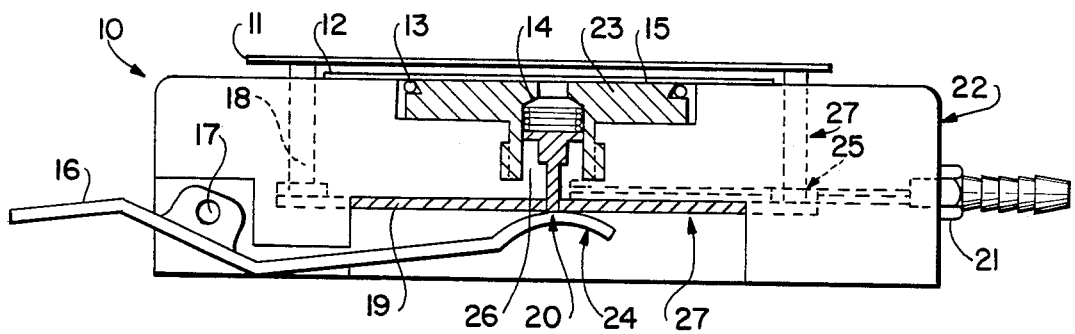
FIG. 2 is a front elevation of an embodiment of the mask removal apparatus of the present invention after the apparatus is actuated.
Figure 3:
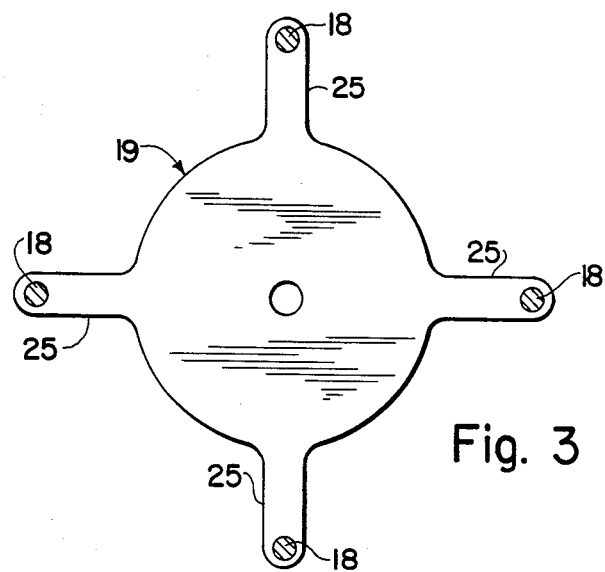
FIG. 3 is a plan view showing the detail of an alternative embodiment of the mask discharge facilitator.

The preferred embodiment of the present invention is illustrated by way of example in FIGS. 1 and 2. With specific reference to FIGS. 1 and 2, the mask removal apparatus 10 includes a base 22 which has a vacuum chamber 26 therein. The vacuum chamber 26 opens onto the surface of the base 22.

In preferred form, a vacuum chuck 23 is mounted by conventional means to the top surface of said base 22. The vacuum chuck 23 is also operatively connected to said vacuum chamber 26, so that when a vacuum is drawn in the chamber, the vacuum chuck becomes capable of holding a workpiece, such as a semiconductor wafer 12, in a fixed position. The purpose of the vacuum chuck is to spread the vacuum over a broad area, thus reducing stresses that may be transferred to the wafer. Alternative means to a vacuum chuck may be utilized as a workpiece holder in alternative embodiments of this invention. An example of such a workpiece holder is a conventional mechanical clamp that may be activated and deactivated by a solenoid. A vacuum seal 13 is placed around the top surface 15 of the vacuum chuck 23. The seal may typically be an O-ring, quad ring, or other type of conventional resilient seal. The wafer 12 rests on the seal 13 during operation so that minimal mechanical stresses are transferred to the wafer.

In the preferred embodiment, a vacuum line 21 is connected from a vacuum source (not shown) to the vacuum chamber 26. A vacuum valve 20 is located between the vacuum chamber 26 and vacuum line 21. In preferred form the vacuum valve is a vertically actuated vacuum valve 20 which is maintained in a normally closed position by a biasing spring 14. In FIG. 1, the biasing spring 14 and valve 20 are shown in the normally closed position; in FIG. 2 the biasing spring 14 and valve 20 are shown in the open position.

The vacuum valve may be actuated and deactivated by conventional activation means such as solenoids or switches. The preferred actuation means is a lever 16 which is suitably attached to the base 22 by a pivot pin 17. The pivot pin may be a shoulder screw, bolt, or other type of conventional hardware that one skilled in the art would use to support, and serve as a pivot point for a lever arm.

The lever 16 has an end portion 24 that operatively engages vertical valve 20. When lever 16 is actuated by a force being applied to it the lever pivots around pivot pin 17 and the end portion 24 of lever 16 opens the normally closed vacuum valve 20.

In addition to operatively engaging valve 20, the lever simultaneously engages the horizontal plate 19 of a discharge facilitator 27 exerting an upward force on plate 19. Attached to the periphery of the horizontal plate 19 are a plurality of vertical extensions 18. In preferred form there are 4 vertical pins 18. Each pin is spaced a distance from the center of plate 19 that is greater than the radius of wafer 12, but less than the radius of mask 11. This allows the pins 18 to contact the peripheral edges of mask 11 when the horizontal plat 19 is raised by the end portion 24 of lever 16. The spacing of the pins 18 is as such because the mask 11 overhangs the edge of wafer 12 thus the pins are guaranteed to contact the mask when spaced in this manner.

An alternative embodiment utilizes a plate 19 having appendages 25 attached thereto as shown in FIG. 13. Each appendage 25 has a vertical pin attached thereto. The spacing of the pins from the center of plate 19 is greater than the radius of wafer 12 and less than the radius of mask 11. Other alternatives may be considered by one skilled in the art, such as a continuous band of vertical extensions 18 extending from the horizontal plate 19.

OPERATION

The operation of the above described mask removal tool 10 is as follows. FIG. 1 shows the mask removal tool 10 in its initial position. A composite made of wafer 12 and mask 11 is placed on vacuum chuck 15 in such a manner that the wafer 12 contacts the surface of the vacuum chuck 15. At this point the wafer 12 is bonded to mask 11 by solder such as tin-lead solder. The bonds are distributed between the opposite faced surfaces of the wafer 12 and mask 11. The pattern of the bonds is dictated by the mask pattern.

After placing the mask-wafer composite on seal 13, the moly mask removal apparatus 10 is actuated by exerting a force on lever 16. When lever 16 is actuated, see FIG. 2, the end portion 24 moves upward lifting valve 20 from its normally closed position forming a passageway through vacuum chamber 26. The forming of passageway 26 allows the vacuum drawn in vacuum line 21 to be drawn in the vacuum chuck 23 and hold down the mask-wafer composite resting on the seal 13 around the top surface 15 of vacuum chuck 23. The wafer 12, which makes contact with the seal 13 is rigidly held in a fixed position in this manner.

When actuated, lever end portion 24 also lifts plate 19. Thus, the plate 19 of the discharge facilitator 27 is simultaneously lifted while the wafer 12 is being held down in a fixed position. As plate 19 is lifted, the vertical pins 18 attached thereto come into contact with the bottom surface of mask 11. As plate 19 continues to rise the pins 18 continue to exert an upward force on the periphery of mask 11. Thus, simultaneously, the wafer 12 is held in a fixed position while the upward force of the vertical pins 18 against the bottom surface of mask 11 causes the mask 11 to separate from wafer 12.

The separation of the mask 11 from wafer 12 occurs in a uniform and repeatable manner using the mask removal apparatus 10. No damage is done to either the mask 11 or wafer 12 using this invention. Thus, yields are increased and manufacturing costs and process times are decreased.

After the separation of mask 11 from wafer 12 by the compound mechanical operation comprising a simultaneously applied vacuum force and upwardly applied vertical force exerted by vertical pins 18, lever 16 is released.

Upon the release of lever 16, normally closed biased spring 14 forces valve 20 back to its original normally closed position, thus, closing the passageway through vacuum chamber 26, shutting off the vacuum source drawn through vacuum line 11. Vacuum chamber 23 is vented to the atmosphere. Wafer 12 is no longer held by the vacuum at this point and may be simply removed. After removal of wafer 12, the next bonded wafer 12/mask 11 composite is placed on vacuum chuck 15 as shown in FIG. 1. The above operation is then repeated.

While the present invention has been disclosed in connection with the preferred embodiment thereof, it should be understood that there may be other embodiments which fall within the spirit and scope of the invention as defined by the following claims.

I claim:

1. An apparatus for removing a mask which extends beyond the outer edges of a semiconductor wafer bonded thereto, comprising:
    means for applying a holding force to said wafer for maintaining said wafer in a fixed position,
    means for imparting a force in the opposite direction of said holding force including, a discharge facilitator having a horizontal plate, having a plurality of vertical pins attached thereto, said pins being spaced a distance from the center of said plate that is greater than the radius of said wafers and less than the radius of said masks, said pins extending upwardly toward said wafer; and an actuator for lifting said discharge facilitator so that the pins of said facilitator make upwardly forceful contact with said mask, both of said means having their respective forces applied simultaneously to effect separation of said mask from said semiconductor wafer.

2. The apparatus of claim 1 wherein said discharge facilitator comprises,
    a horizontal plate having a plurality of appendages attached thereto,
    each appendage having a vertical pin attached thereto,
    said pins being spaced a distance from the center of said plate that is greater than the radius of said wafers and less than the radius of said masks,
    said pins extending upwardly toward said wafer.

3. An apparatus for removing a mask which extends beyond the outer edges of a semiconductor wafer bonded thereto, comprising:
    vacuum means for applying a holding force to said wafer for maintaining said wafer in a fixed position,
    a discharge facilitator having a horizontal plate with a plurality of appendages, each appendage having a vertical pin attached thereto, said pins extending toward said wafer and being spaced a distance from the center of said plate that is greater than the radius of said wafer and less than the radius of said mask,
    an actuator comprising a lever arm pivotally attached to said mask removal apparatus for lifting said discharge facilitator so that the pins of said facilitator apply a parting force on said mask to effect its separation from said wafer,
    said vacuum means, said discharge facilitator, and said actuator having their respective forces applied simultaneously to effect separation of said mask from said semiconductor wafer.

4. The apparatus of claim 3 wherein said vacuum means comprises,
a vacuum supply, and
a vacuum chuck, suitably connected to said vacuum supply.

5. The apparatus of claim 3 wherein said vacuum means comprises,
a base portion having a central vacuum chamber opening onto the upper surface thereof;
a vacuum chuck being suitably attached to the upper surface of said base, and operatively connected to said vacuum chamber,
a vacuum valve, separating said vacuum chamber from a vacuum source;
said vacuum valve being spring biased to maintain a normally closed position.

6. The apparatus of claim 5 wherein said lever arm, when actuated, contacts and opens said vacuum valve to enable the drawing of a vacuum to cause said underside of said wafer to adhere to a seal around said vacuum chuck.

7. The apparatus of claim 6 wherein said vacuum valve is a vertically actuated vacuum valve.

8. An apparatus for removing a mask which extends beyond the outer edges of a semiconductor wafer bonded thereto, comprising;
a base having a vacuum chamber opening onto the upper surface thereof;
a vacuum valve separating said vacuum chamber from a vacuum source;
an actuator for opening and closing said vacuum valve;
a discharge facilitator, having a horizontal plate, having a plurality of vertical pins attached thereto, said pins being spaced a distance from the center of said plate that is greater than the radius of said wafers and less than the radius of said masks,
said pins extending upwardly toward said wafer, for contacting the underside surface of said mask whose peripheral edge extend beyond the peripheral edge of a wafer attached thereto;
said actuator, when actuated, opens said vacuum valve to enable the drawing of a vacuum in said chamber to cause the underside of said wafer to adhere to the upper surface of said base;
said actuator lifting said plate to bring said pins upwardly into forceful contact with said mask, applying a parting force to effect the separation of said mask from the upper surface of said wafer.

9. The apparatus of claim 8 wherein said discharge facilitator comprises;
a horizontal plate having a plurality of appendages attached thereto,
each appendage having a vertical pin attached thereto,
said pins being spaced a distance from the center of said plate that is greater than the radius of said wafers and less than the radius of said masks,
said pins extending upwardly toward said wafer, for contacting the underside surface of said mask whose peripheral edge extend beyond the peripheral edge of a wafer attached thereto.

10. the apparatus of claims 8 or 9 wherein said actuator comprises a lever pivotally mounted to said base and operatively contacting the bottom of said vacuum valve,
said lever, when actuated, opens said vacuum valve to enable the drawing of a vacuum in said chamber to cause the underside of said wafer to adhere to the upper surface of said base;
said lever lifting said plate to bring said pins into upwardly into forceful contact with said mask, applying a parting force to effect the separation of said mask from the upper surface of said wafer.

11. The apparatus of claims 8 or 9 further comprising a vacuum chuck,
said vacuum chuck being suitably connected to the upper surface of said base, and operatively connected to said vacuum chamber,
said wafer being held in a fixed position by a seal surrounding said vacuum chuck.

12. The apparatus of claims 8 or 9 wherein said vacuum valve is a vertically actuated vacuum valve.

13. The apparatus of claim 12 wherein said vacuum valve is biased to maintain a normally closed position.

14. An apparatus for removing a mask which extends beyond the outer edges of a semiconductor wafer comprising:
a base having a vacuum chamber opening onto the upper surface thereof;
a vacuum chuck being suitably connected to the upper surface of said base, and operatively connected to said vacuum chamber;
a resilient seal surrounding said vacuum chuck;
a vertically actuated vacuum valve separating said vacuum chamber from a vacuum source, said vacuum valve being spring biased to maintain a normally closed position;
an actuating lever pivotally mounted to said base and operatively contacting the bottom of said valve when actuated;
a discharge facilitator having a horizontal plate having a plurality of appendages attached thereto, each appendage having a vertical pin attached thereto for contacting the underside of a mask whose peripheral edges extend beyond the peripheral edge of a semiconductor wafer attached thereto;
said lever, when actuated, simultaneously opens said vacuum valve to enable the drawing of a vacuum in said chamber to cause the underside of said wafer to adhere to the upper surface of said base; and
lifts said plate to bring said pins into upwardly into forceful contact with said mask, applying a parting force to effect the separation of said mask from the upper surface of said wafer.

* * * * *